United States Patent

Tazawa et al.

[11] Patent Number: 5,861,728
[45] Date of Patent: Jan. 19, 1999

[54] METHOD FOR MEASURING MOTOR PARAMETERS OF INDUCTION MOTOR AND CONTROL APPARATUS

[75] Inventors: Toru Tazawa; Sadahiro Matsuura; Shigeru Satoh, all of Osaka, Japan

[73] Assignee: Matsushita Electric Industrial Co., Ltd., Osaka, Japan

[21] Appl. No.: 847,147

[22] Filed: Apr. 30, 1997

[30] Foreign Application Priority Data

May 9, 1996 [JP] Japan .................................. 8-115028

[51] Int. Cl.$^6$ ........................................................ H02P 1/26
[52] U.S. Cl. ............................ 318/778; 318/727; 318/798
[58] Field of Search .................................. 318/778, 727, 318/798–815

[56] References Cited

U.S. PATENT DOCUMENTS

| | | | |
|---|---|---|---|
| 4,670,698 | 6/1987 | Fulton et al. | 318/802 |
| 4,672,288 | 6/1987 | Abbondanti | 318/803 |
| 5,388,052 | 2/1995 | Mann . | |

FOREIGN PATENT DOCUMENTS

| | | |
|---|---|---|
| 2-304280 | 12/1990 | Japan . |
| 6-153568 | 5/1994 | Japan . |
| 7-075399 | 3/1995 | Japan . |

*Primary Examiner*—Karen Masih
*Attorney, Agent, or Firm*—Merchant, Gould, Smith, Edell, Welter & Schmidt, P.A.

[57] ABSTRACT

A method for readily measuring each motor parameter with high precision, with an induction motor at rest, and an apparatus for controlling the induction motor using these motor parameters are provided. The induction motor is set to a single-phase feed state or a feed state equivalent to that state. First, a stator resistance is measured from a current value and a voltage value at the time when a direct current command is given. Then, the current command of a current having an appropriately high frequency and a known current differential value is given to find a rotor resistance and a leakage inductance from current values and voltage values at two different times and the previously obtained stator resistance value. Then, the current command of a sine wave current having an appropriately low frequency is given to find a mutual inductance using the current value and the voltage value at the time. These measured values are used for a slip frequency operation and a speed estimation operation.

22 Claims, 8 Drawing Sheets

METHOD FOR MEASURING MOTOR PARAMETERS OF INDUCTION MOTOR AND CONTROL APPARATUS

BACKGROUND OF THE INVENTION

1. Field of the Invention

The present invention relates to a method for measuring each motor parameter required for vector control operations of an induction motor, and to a control apparatus for an induction motor comprising a measuring system.

2. Description of the Prior Art

Vector control systems having both excellent response and precision have been put to practical use for variable speed control of induction motors. In this vector control, an input current to an induction motor is separated into an excitation current for generating a magnetic flux and a torque current for generating a torque. As the motor torque is proportional to the torque current when the excitation current is constant, the excitation current and the torque current are controlled according to a torque command value and the rotational speed of the induction motor.

Figure 8:
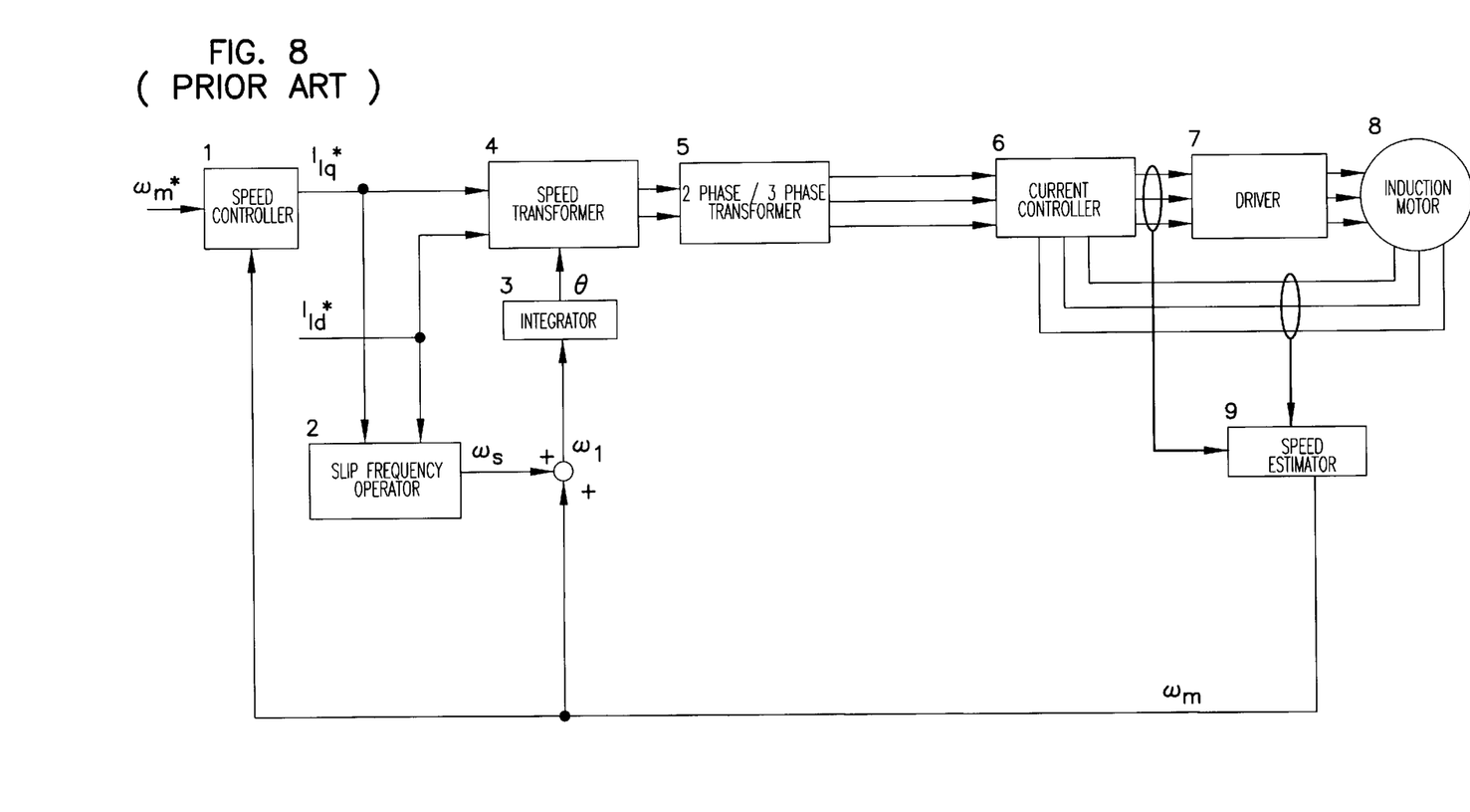
FIG. 8 shows a block diagram of a prior art vector control circuit.

FIG. 8 shows a block diagram of a conventional control circuit of an induction motor using vector control. In FIG. 8, when a speed command $\omega_m^*$ and a motor speed $\omega_m$, output from a speed estimator 9 of an induction motor 8, are input to a speed controller 1, it outputs a torque current command $I_{1q}^*$ according to a difference between the two inputs. This block diagram relates to speed control. However, for torque control, the speed controller is replaced by a torque current command means for transforming a torque command to a torque current command $I_{1q}^*$ to be output.

The torque current command $I_{1q}^*$ and an excitation current command $I_{1d}^*$ are input to a slip frequency operator 2, which outputs a slip angular frequency $\omega_s$. The excitation current command has a predetermined value determined by the induction motor.

The sum of the slip angular frequency $\omega_s$ and the detected speed $\omega_m$, that is, a rotating magnetic field velocity $\omega_1$, is input to an integrator 3, which integrates it to output a phase $\theta$. The torque current command $I_{1q}^*$ the excitation current command $I_{1d}^*$, and the phase $\theta$ are input to a rotary/stationary coordinate transformer 4. The output of the rotary/stationary coordinate transformer 4 is transformed to a three-phase current command in a two-phase/three-phase transformer 5 to be provided to a current controller 6.

The current controller 6 produces a PWM (Pulse Width Modulation) signal from the three-phase current command to be output to a driver 7. The driver 7 generates a drive voltage from the input PWM signal to be provided to the induction motor 8 for drive. The input current to the induction motor is fed back to the current controller 6 to be controlled to follow the three-phase current command.

In the speed estimator 9, a motor speed is estimated by using a detected or commanded voltage of the induction motor, a detected motor current, and set motor parameters.

In FIG. 8, the rotational speed of the induction motor is found by the speed estimator 9. However, it may be detected using a speed sensor.

Motor parameters are used for the operation of a slip frequency in the slip frequency operator 2. Also, motor parameters are used for an estimation operation in the speed estimator 9. Therefore, motor parameters should be obtained by some method before motor running.

Conventionally, stator winding resistance measurement, a no-load test, and a rotor locked test are known as methods for obtaining the motor parameters of an induction motor. Also, a method requiring the no-load rotation of an induction motor as described in Laid-open Japanese Patent Application No. (Tokkai hei) 7-75399, and a method requiring a rotor locked test as described in Laid-open Japanese Patent Application No. (Tokkai hei) 6-153568 are proposed.

However, it is difficult to create a no-load state or a rotor locked state in the measurement of a motor already installed in facilities. As a measurement method with a motor at rest, there is a method based on a model accommodation system as described in Laid-open Japanese Patent Application No. (Tokkai hei) 2-304380. However, this method has a disadvantage in that operations are complicated.

SUMMARY OF THE INVENTION

In view of the above situation, the present invention seeks to provide a simple method for measuring each motor parameter of an induction motor with high precision, with the motor stopped, and a control apparatus for an induction motor comprising a measurement system.

In order to achieve the above objects, a method for measuring motor parameters of an induction motor according to the present invention comprises applying a voltage to an induction motor to cause a direct current to flow to find a stator resistance from the applied voltage value and the detected current value. Then a voltage is applied to cause a current having a frequency of a predetermined value or more and a known current differential value to flow to find the sum of the stator resistance and a rotor resistance as well as a leakage inductance value from the applied voltage value and the detected current value. Lastly a voltage is applied to cause a sine wave current having a predetermined frequency to flow to find a mutual inductance from the applied voltage and the detected current as well as from the stator resistance, the rotor resistance, and the leakage inductance already obtained.

Specifically, the method comprises the steps of applying a voltage to an induction motor in a single-phase feed state to cause a sine wave current having a predetermined angular frequency $\omega_1$ to flow, and solving the following equation to find a mutual inductance value M', $$\begin{cases} k_1 = \dfrac{-\omega_1 L_o R'_2 - \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{R_1^2 + (\omega_1 L_o)^2 - Z^2} \\ M' = \dfrac{R'_2}{k_1 \omega_1} \end{cases} \quad (1)$$

where $V_1$ represents a value of an applied voltage, $I_1$ represents a value of a motor current, Z represents a ratio of the applied voltage to the motor current $|V_1|/|I_1|$, and $R_1$, $R_2'$, and $L\sigma$ represent a known stator resistance value, a rotor resistance value, and a leakage inductance value of a T-I type equivalent circuit of an induction motor, respectively.

Another method comprises the steps of applying a voltage to an induction motor in a single-phase feed state to cause a sine wave current having a predetermined angular frequency $\omega_1$ to flow, and solving the following equation to find a mutual inductance value M', $$\begin{cases} k_2 = \dfrac{-\omega_1 L_o R'_2 - \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{(R_1^2 + R'_2)^2 + (\omega_1 L_o)^2 - Z^2} \\ M' = \dfrac{k_2 R'_2}{\omega_1} \end{cases} \quad (2)$$

where $V_1$ represents a value of an applied voltage, $I_1$ represents a value of a motor current, Z represents a ratio of the applied voltage to the motor current $|V_1|/|I_{11}|$, and $R_1$, $R_2$ and $L\sigma$ represent a known stator resistance value, a rotor resistance value, and a leakage inductance value of a T-I type equivalent circuit of an induction motor, respectively.

In a preferred method, the predetermined angular frequency $\omega_1$ is selected in accordance with the following expression, $$\omega_1 < \sqrt{\dfrac{R'_2(2R_1 + R'_2)}{2L_o M'}} \quad (3)$$

where $R_1$, $R_2'$, and $L\sigma$ represent a stator resistance value, a rotor resistance value, and a leakage inductance value of the induction motor, respectively, and M' represents a standard mutual inductance value of an induction motor having the same power as the induction motor to be measured.

DESCRIPTION OF THE PREFERRED EMBODIMENTS

The embodiments of the present invention will be described below in connection with the accompanying drawings.

Figure 1:
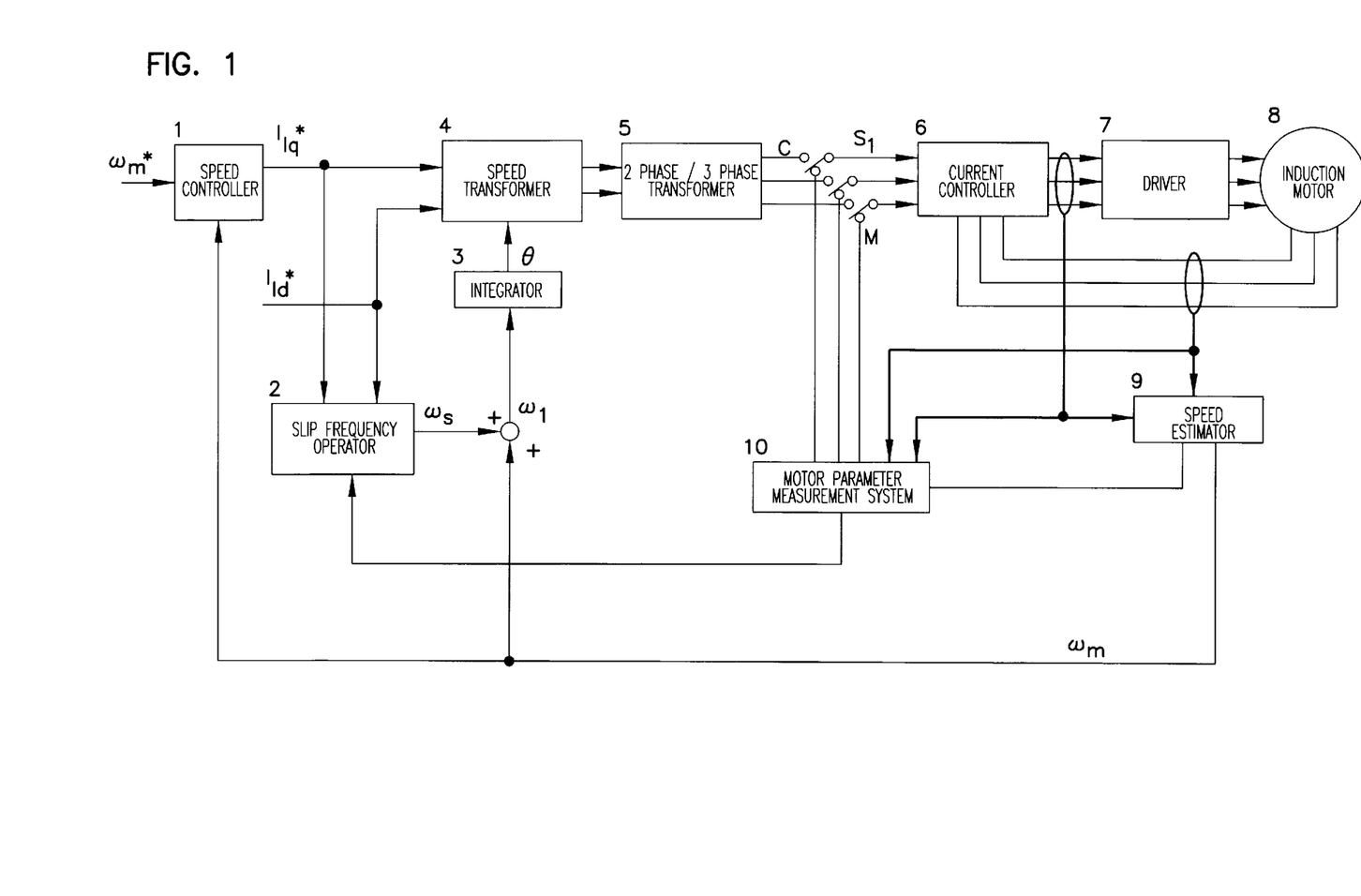
FIG. 1 shows a block diagram of a vector control circuit in an embodiment according to the present invention.

FIG. 1 shows a block diagram of a control circuit of an induction motor according to the present invention. In FIG. 1, a motor parameter measurement system 10 is added to the prior art block diagram of FIG. 8. The motor parameter measurement system 10 functions when the motor is not running, and makes a motor parameter measurement.

In a measurement mode, a switch S1 is switched to the M side to provide a current command for measurement to a current controller 6. In an operation mode, the switch S1 is switched to the C side to control the speed of an induction motor 8. The switch S1 may be implemented by software.

The motor parameter measurement system 10 outputs a current command for measurement. What type of current command is output will be described later. An input current to the induction motor is fed back to the current controller 6 to be controlled to follow the current command from the motor parameter measurement system. The motor parameter measurement system 10 calculates motor parameters using a detected current and a detected or commanded voltage at the time. The calculated motor parameters are input to a slip frequency operator and a speed estimator to be used as parameters for motor running.

Next, the current command for measurement will be described below.

Figure 2:
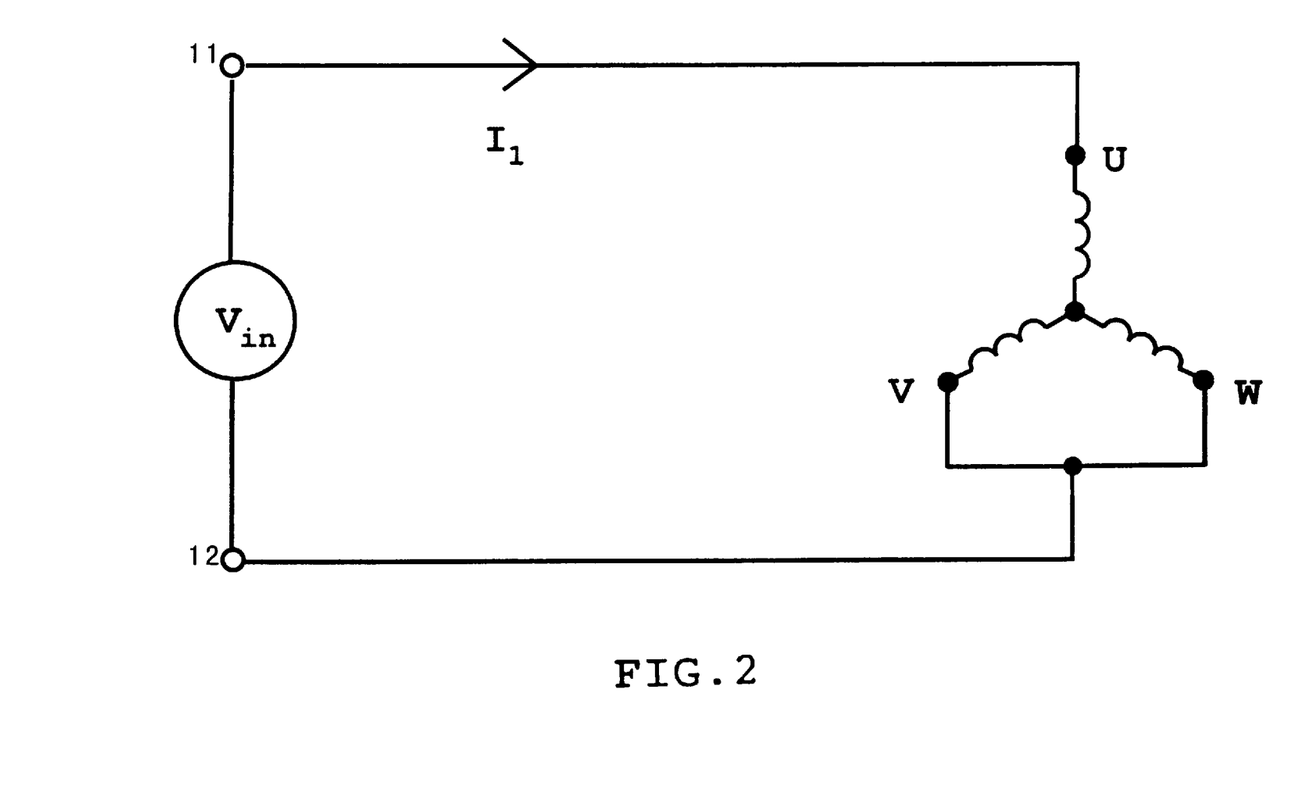
FIG. 2 shows an electrical connection state of an induction motor in an embodiment according to the present invention.

Since the induction motor is in a stopped state under no control, and also considering that the motor is connected to the load, the measurement is made with the induction motor stopped. For this purpose, the measurement is made in a single-phase feed state in which the starting torque is zero. Specifically, a state in which a voltage is applied to the induction motor is such that two of three phases are short-circuited as shown in FIG. 2. In FIG. 2, U, V, and W represent U phase, V phase, and W phase terminals of the induction motor, respectively, $V_{in}$ represents a voltage applied across input terminals 11 and 12, and $I_1$ represents a current. For the short-circuit of the V and W phases, the V and W phases may be literally short-circuited, the V and W phases may have the same electric potential, or the currents flowing through the V and W phases may be set to be equal. Also, the short circuit need not be limited between the V and W phases. The U and V phases or the U and W phases may be short-circuited for making measurements on the W and V phases respectively.

Figure 3:
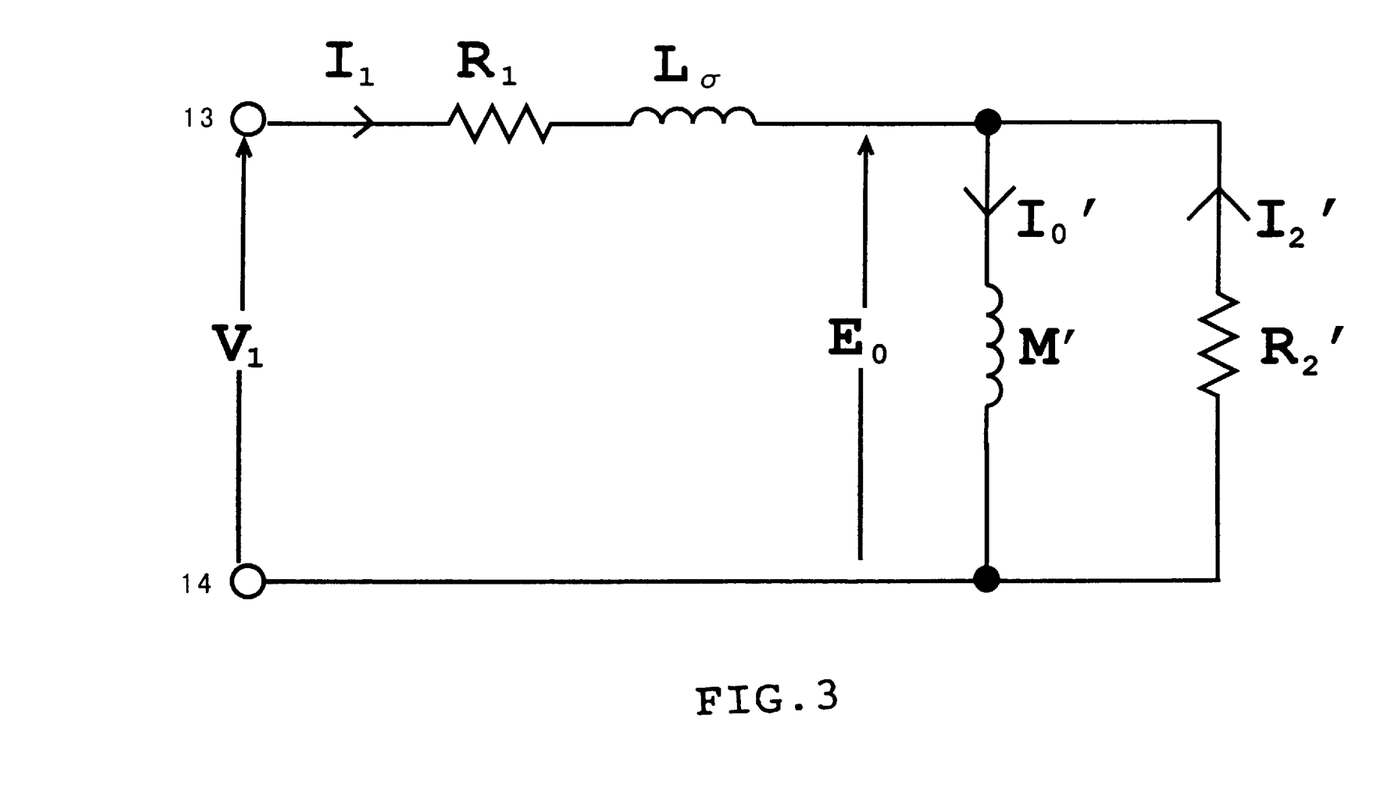
FIG. 3 shows a T-I type equivalent circuit diagram of an induction motor.

FIG. 3 shows a T-I type equivalent circuit of the induction motor for one phase. $R_1$ represents a stator resistance, $L\sigma$ represents a leakage inductance, M' represents a mutual inductance, and $R_2'$ represents a rotor resistance. Also, $V_1$ represents a phase voltage applied across input terminals 13 and 14 of the equivalent Ad circuit, $I_1$ represents a primary current flowing through the equivalent circuit, $I_0'$ represents a current flowing on the mutual inductance M' side, and $I_2'$ represents a current flowing on the rotor resistance $R_2'$ side.

Applying this circuit to FIG. 2, the circuit has the V and W phases in parallel. Therefore, the impedance of the circuit between the input terminals in FIG. 2 is 1.5 times higher than that of the equivalent circuit in FIG. 3. In other words, when the current is the same $I_1$, the following equation holds between the applied voltage $V_{in}$ and the phase voltage $V_1$.

$$V_1 = \dfrac{V_{in}}{1.5} \quad (4)$$

Since the applied voltage $V_{in}$ is practically detectable, the voltage is transformed to the phase voltage $V_1$ of the equivalent circuit by the equation (4) to be used for the following measurement.

Also, instead of short-circuiting two of the three phases, one phase can be opened to implement a single-phase feed state. In this case, the impedance of the induction motor portion is twice as much as that of the equivalent circuit in FIG. 3. Therefore, the phase voltage $V_1$ is used for the following measurement as ½ of the applied voltage.

Figure 4:
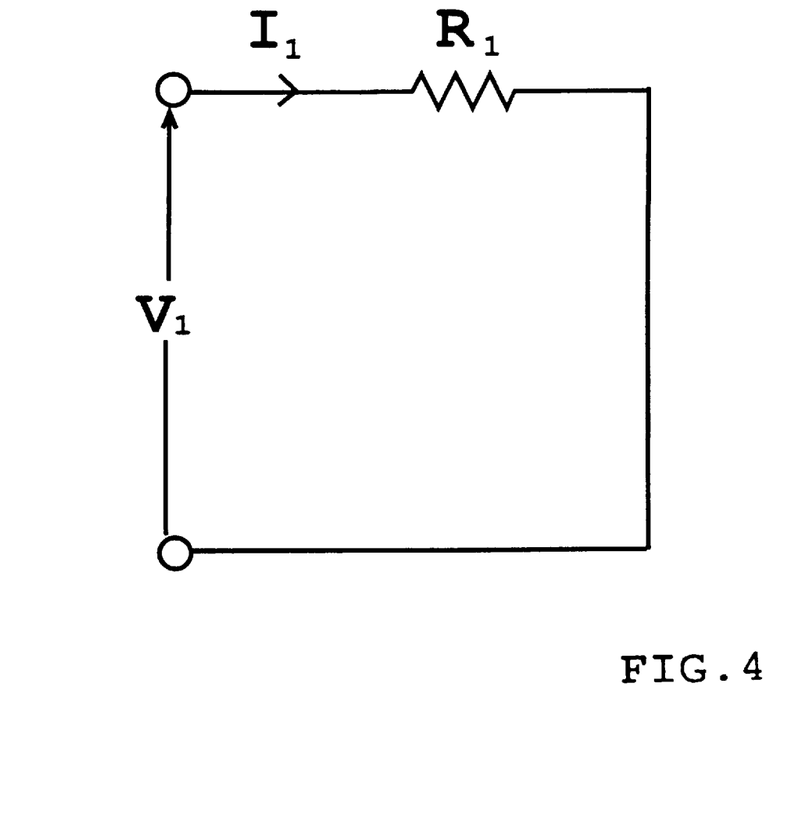
FIG. 4 shows an equivalent circuit diagram when a direct current flows.

First, the stator resistance $R_1$ is measured. When a direct current flows, the current differential value is zero. Therefore, voltage drops at the inductance $L\sigma$ and M' are zero, that is, a short-circuit state occurs. Thus, the equivalent circuit in FIG. 3 can be represented as shown in FIG. 4, representing a circuit having only a stator resistance. In the circuit diagram of FIG. 4, the following equation holds.

$$V_1 = R_1 I_1 \quad (5)$$

Thus, the measurement of the stator resistance can be made as will be described below. A voltage to cause a direct current having a predetermined value to flow is applied to the induction motor. After an appropriate time period, for example, after one second or more for a 2.2 kW motor, a steady state with little change both in current and voltage occurs. The current $I_1$ and the voltage $V_1$ are measured at the time to find the stator resistance $R_1$ by the following equation.

$$R_1 = \frac{V_1}{I_1} \quad (6)$$

Next, the rotor resistance $R_2'$ and the leakage inductance $L\sigma$ are measured.

Figure 5:
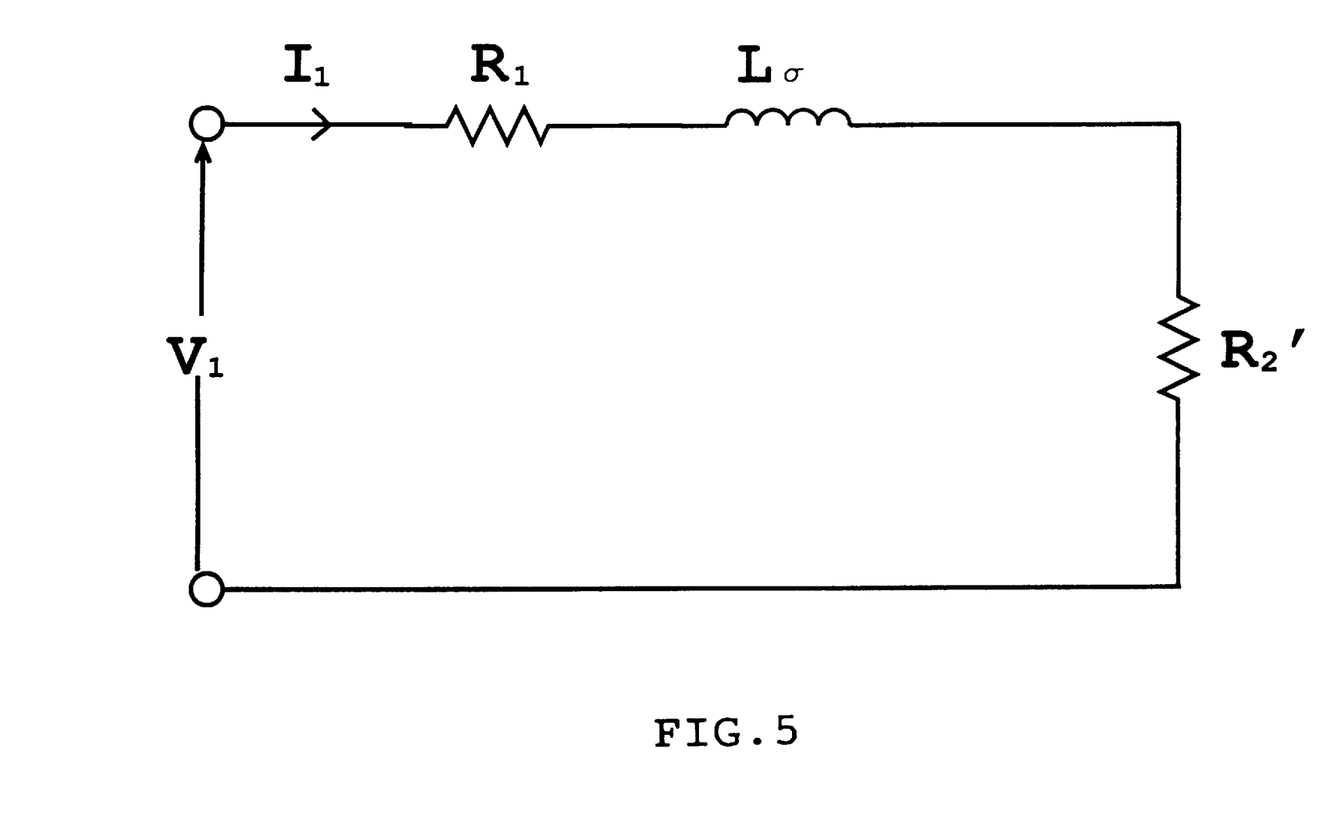
FIG. 5 shows an equivalent circuit diagram when a current having an appropriately high frequency flows.

In FIG. 3, if $I_1$ has the waveform of a current having an appropriately high frequency, the impedance value of the mutual inductance M' is significantly larger than the rotor resistance $R_2'$. Specifically, a frequency close to a rated frequency or more is desired. Then, $I_0'$ hardly flows. Therefore, the circuit can be approximated by an equivalent circuit as shown in FIG. 5 in which the mutual inductance M' is omitted. In other words, the circuit is a series circuit having the stator resistance $R_1$, the leakage inductance $L\sigma$, and the rotor resistance $R_2'$. In the circuit diagram of FIG. 5, the following equation holds.

$$V_1 = (R_1 + R'_2)I_1 + L_\sigma \frac{d}{dt} I_1 \quad (7)$$

A method for measuring a resistance $R_1+R_2'$ and the inductance $L\sigma$ with the equation (7) holding will be described below.

As an example of a current, the current command of a triangular wave current having a rated frequency is provided to apply a voltage to the induction motor to cause such a current to flow. The triangular wave has a period in which the current differential value is constant, and during the measurement period, the differential value of the current command and the differential value of the actual current are considered to be equal. Therefore, the triangular wave is an effective current waveform in that calculation of a current differential value is not required. Suppose that the current waveform and the voltage waveform are as shown in FIG. 6.

Current values and voltage values at different times $t_1$ and $t_2$ are measured. Then, the following equations hold.

$$\begin{cases} V_1(t_1) = (R_1 + R'_2)I_1(t_1) + L_\sigma \frac{d}{dt} I_1|_{t=t_1} \\ V_1(t_2) = (R_1 + R'_2)I_1(t_2) + L_\sigma \frac{d}{dt} I_1|_{t=t_2} \end{cases} \quad (8)$$

Figure 6:
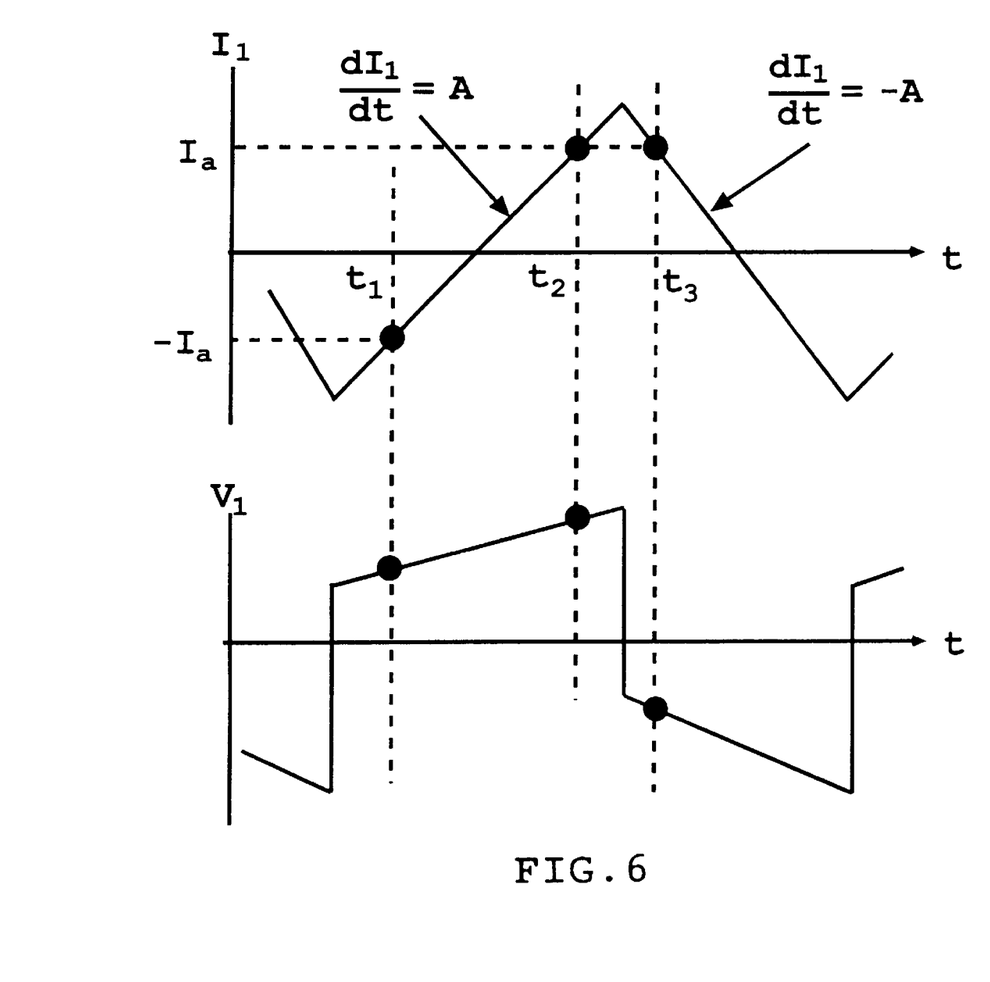
FIG. 6 shows respective examples of current and voltage waveforms in the circuit of FIG. 4.

In the example of the waveform in FIG. 6, $I_1[t_1]=-I_a$, $I^1[t_2]=I_a$, and $dI_1/dt[t=t1]=dI_1/dt[t=t2]=A$. "A" represents a slope of the triangular wave, and this value is obtained from the current command. Therefore, simultaneous equations of two variables $R_1+R_2'$ and $L\sigma$ hold. By solving these equations, $R_1+R_2'$ and $L\sigma$ are found through the following equations.

$$R_1 + R'_2 = -\frac{V_1(t_1) - V_1(t_2)}{2I_\alpha} \quad (9)$$

$$L_\sigma = \frac{V_1(t_1) + V_1(t_2)}{2A} \quad (10)$$

Then, the previously obtained stator resistance $R_1$ is subtracted from $R_1+R_2'$ obtained by the equation (9) to find the rotor resistance $R_2'$.

A similar method can be applied when using current values and voltage values at the times $t_2$ and $t_3$ in FIG. 6. Then, $I_1[t_2]=I_1[t_3]=I_a$, $dI_1/dt[t=t2]=A$, and $dI_1/dt[t=t3]=-A$. When substituting these to solve the equations (8), $R_1+R_2'$ and $L\sigma$ are found as the following equations.

$$R_1 + R'_2 = \frac{V_1(t_2) + V_1(t_3)}{2I_\alpha} \quad (11)$$

$$L_\sigma = \frac{V_1(t_2) - V_1(t_3)}{2A} \quad (12)$$

Thus, the sum of the stator resistance and the rotor resistance and the leakage inductance can be found by a simple method using typical sample data at only two points. The two points need not be limited to the above two points. Any two points can be used where the pair of equations (8) are not homogeneous, since the equations can be similarly solved, provided that only the coefficients of the above two variables are different.

When applying a voltage according to the current command, normally, the current feedback is performed. In this case, when the frequency of the triangular wave is too high, the current following is not complete. Therefore, the current differential value is not equal to the command. Thus, the frequency of the current is preferably close to the rated frequency. While the triangular wave is used as a current signal waveform in the above embodiment, any waveform may be used if it is of a current having an appropriately high frequency and a known current differential value.

Lastly, the mutual inductance M' is measured. In FIG. 3, when $I_1$ has the waveform of a current having an appropriately low frequency, the current $I_0'$ flowing through the mutual inductance is not negligible. When the power supply angular frequency is set to $\omega_1$, the following equation holds in FIG. 3.

$$E_0 = j\omega_1 M'I_0' = -R'_2 I'_2 \quad (13)$$

When the following equation (14) holds, the following equation (15) is derived from the equation (13).

$$\frac{R'_2}{\omega_1 M'} = k_1 \tag{14}$$

$$I'_0 = jk_1 I'_2 \tag{15}$$

Also, the following equations hold in FIG. 3.

$$I_1 + I'_2 = I'_0 \tag{16}$$

$$V_1 = (R_1 + j\omega_1 L_\sigma) I_1 - R'_2 I'_2 \tag{17}$$

When $I_0'$ is eliminated from the equations (15) and (16), and $I_2'$ is also eliminated using the equation (17), the following equation is obtained.

$$\frac{V_1}{I_1} = \frac{\{(R_1 + R'_2) + \omega_1 L_\sigma k_1\} + j(\omega_1 L_\sigma - R_1 k_1)}{1 - jk_1} \tag{18}$$

Therefore, the following equation holds.

$$\left(\frac{|V_1|}{|I_1|}\right)^2 = \frac{\{(R_1 + R'_2)^2 + \omega_1 L_\sigma k_1\}^2 + (\omega_1 L_\sigma - R_1 k_1)^2}{1 + k_1^2} \tag{19}$$

In the equation (19), when $|V_1|/|I_1|=Z$, the following equation with respect to $k_1$ is obtained.

$$\{R_1^2 + (\omega_1 L_\sigma)^2 - Z^2\}k_1^2 + 2\omega_1 L_\sigma R'_2 k_1 + \{(R_1 + R'_2)^2 + (\omega_1 L_\sigma)^2 - Z^2\} = 0 \tag{20}$$

When solving the equation (20), the following equation is obtained.

$$k_1 = \frac{-\omega_1 L_\sigma R'_2 - \sqrt{(\omega_1 L_\sigma R'_2)^2 - \{R_1^2 + (\omega_1 L_\sigma)^2 - Z^2\}\{(R_1 + R'_2)^2 + (\omega_1 L_\sigma)^2 - Z^2\}}}{R_1^2 + (\omega_1 L_\sigma)^2 - Z^2} \tag{21}$$

In the equation (21), two roots exist. Since the root to be found is a positive value, the distinction can be made easily if the two roots in the equation (21) are of different signs. The equation (21) is a quadratic equation with respect to $k_1$. Therefore, setting the two roots to $\alpha$ and $\beta$, the following expression is obtained from the relationship between the roots and coefficients.

$$\alpha\beta < \frac{R_1^2 + (\omega_1 L_\sigma)^2 - Z^2}{(R_1 + R'_2)^2 + (\omega_1 L_\sigma)^2 - Z^2} \tag{22}$$

Here, $(R_1+R_2')^2 > R_1^2$, and therefore the following expressions are obtained from the equation (20).

$$(R_1 + R'_2)^2 + (\omega_1 L_\sigma)^2 - Z^2 > 0 \tag{23}$$

$$R_1^2 + (\omega_1 L_\sigma)^2 - Z^2 < 0 \tag{24}$$

When the equation (19) is substituted in $Z^2 = (|V_1|/|I_1|)^2$, and $k^1$ is eliminated using the equation (14), the expressions (23) and (24) are changed to the following expressions (25) and (26) respectively.

$$\omega_1 < \sqrt{\frac{R'_2(2R_1 + R'_2)}{2L_\sigma M'}} \tag{25}$$

$$\omega_1(2M'R_1 + 2L_\sigma R'_2 + M'R'_2) > 0 \tag{26}$$

It is understood that since the expression (26) is always true, the measurement should be made at an angular frequency satisfying the expression (25). In the expression (25), a value M' to be measured is included. In measurement, the standard mutual inductance value of a motor having the same power as the motor to be measured can be used as the value to determine $\omega_1$.

In this case, the positive one of the roots in the equation (21) is a solution to be found. Therefore, the following equation is obtained.

$$k_1 = \frac{-\omega_1 L_\sigma R'_2 - \sqrt{(\omega_1 L_\sigma R'_2)^2 - \{R_1^2 + (\omega_1 L_\sigma)^2 - Z^2\}\{(R_1 + R'_2)^2 + (\omega_1 L_\sigma)^2 - Z^2\}}}{R_1^2 + (\omega_1 L_\sigma)^2 - Z^2} \tag{27}$$

When $k_1$ is found, the mutual inductance M' is found from the equation (14).

Therefore, the current command of a sine wave current having an appropriately low frequency is given to measure the magnitudes of the voltage and the current at the time to find their ratio Z. A frequency satisfying the expression (25) is used. However, a state similar to that in which a direct-current voltage is applied occurs at a frequency too close to zero. Therefore, a higher frequency within the range satisfying the expression (25) is desired. For example, 1 to 5 Hz is desired for a 2.2 kW induction motor. $k_1$ is found by the equation (27) using the previously obtained $R_1$, $R_2'$, and $L\sigma$. The mutual inductance M' is found by the equation (14).

Using the following equation instead of the equation (14), a similar theory can be developed.

$$\frac{R'_2}{\omega_1 M'} = k_2 \tag{28}$$

Then, the equation with respect to $k_2$ such as the equation (20) will be as follows.

$$\{(R_1 + R'_2)^2 + (\omega_1 L_\sigma)^2 - Z^2\}k_2^2 + 2\omega_1 L_\sigma R'_2 k_2 + \{R_1^2 + (\omega_1 L_\sigma)^2 - Z^2\} = 0 \tag{29}$$

Solving this equation, the following equation (30) is obtained.

$$k_2 = \frac{-\omega_1 L_o R'_2 \pm \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{(R_1^2 + R'_2)^2 + (\omega_1 L_o)^2 - Z^2} \quad (30)$$

In the equation (30), also, two roots exist. It is also understood that, when seeking the condition under which the roots are different signs, the expression (25) should be satisfied. When the measurement is made at $\omega_1$ satisfying the expression (25), the positive one of the two roots in the equation (27) is obtained as the following equation.

$$k_2 = \frac{-\omega_1 L_o R'_2 + \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{(R_1^2 + R'_2)^2 + (\omega_1 L_o)^2 - Z^2} \quad (31)$$

When $k_2$ is found, the mutual inductance M' can be found from the equation (28).

For the mutual inductance value used for vector control, 3/2 of M' obtained by the above method is used. This is because the mutual inductance value in three-phase power supply is 3/2 of that in single-phase power supply.

Figure 7:
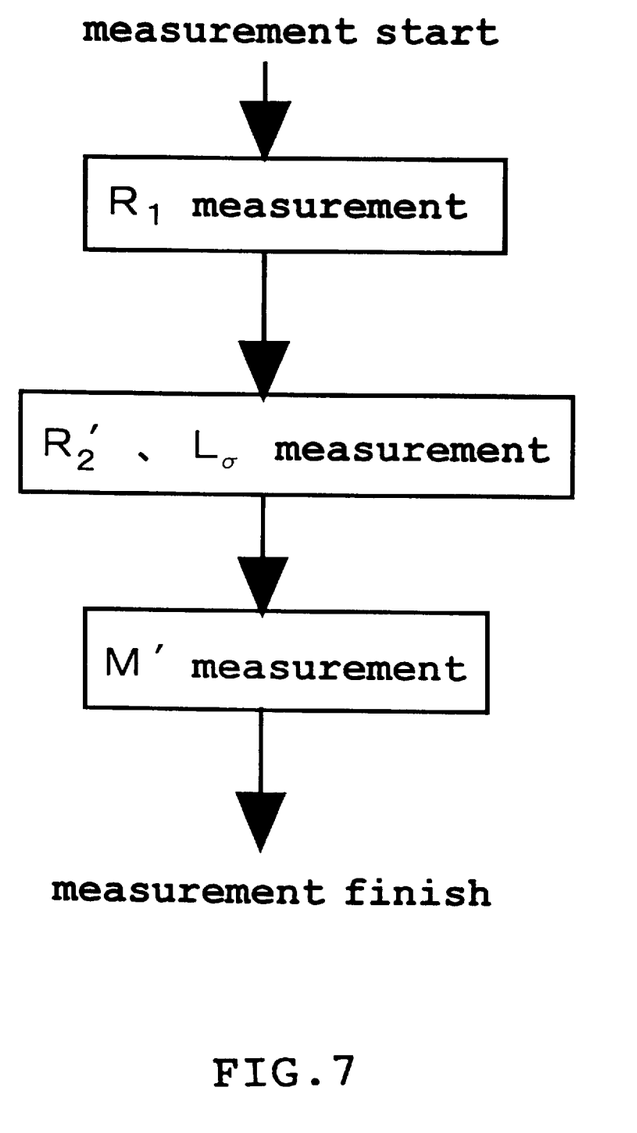
FIG. 7 shows a flow chart for a measurement method according to the present invention.

The flow of the measurement is summarized in FIG. 7.

As mentioned above, according to the present invention, each motor parameter of the stator resistance, the rotor resistance, the leakage inductance, and the mutual inductance of an induction motor can be readily measured with the motor at rest. Therefore, the measurement can be made even if the induction motor is connected to the load. Also, vector control can be performed with high precision by slipping the frequency and estimating the speed using the values.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method for measuring motor parameters of an induction motor, comprising the steps of:
    applying a voltage to an induction motor in a single-phase feed state to cause a current having a frequency of a predetermined value or more and a known current differential value to flow;
    solving two equations obtained from values of applied voltages and values of motor currents at two different times and the current differential value to find a sum of a stator resistance value and a rotor resistance value of a T-I type equivalent circuit of the induction motor; and
    finding the rotor resistance value from a difference between the sum of the stator resistance value and the rotor resistance value and the known stator resistance value.

2. The method according to claim 1, wherein the current to flow in the induction motor has a triangular waveform.

3. The method according to claim 1, wherein times at which differential values of motor current are equal and current values are different are selected as the two different times.

4. The method according to claim 1, wherein times at which differential values of motor current are different and current values are equal are selected as the two different times.

5. A method for measuring motor parameters of an induction motor, comprising the steps of:
    applying a voltage to an induction motor in a single-phase feed state to cause a current having a frequency of a predetermined value or more and a known current differential value to flow; and
    solving two equations obtained from values of applied voltages and values of motor currents at two different times and the current differential value to find a leakage inductance value of a T-I type equivalent circuit of the induction motor.

6. The method according to claim 5, wherein the current to flow in the induction motor has a triangular waveform.

7. The method according to claim 5, wherein times at which differential values of motor current are equal and current values are different are selected as the two different times.

8. The method according to claim 5, wherein times at which differential values of motor current are different and current values are equal are selected as the two different times.

9. A method for measuring motor parameters of an induction motor, comprising the steps of:
    applying a voltage to an induction motor in a single-phase feed state to cause a sine wave current having a predetermined angular frequency $\omega_1$ to flow; and
    solving the following equation to find a mutual inductance value M', $$\begin{cases} k_1 = \dfrac{-\omega_1 L_o R'_2 - \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{R_1^2 + (\omega_1 L_o)^2 - Z^2} \\ \\ M' = \dfrac{R'_2}{k_1 \omega_1} \end{cases}$$

where $V_1$ represents a value of an applied voltage, $I_1$ represents a value of a motor current, Z represents a ratio of the applied voltage to the motor current $|V_1|/|I_1|$, and $R_1$, $R_2'$, and $L\sigma$ represent a known stator resistance value, a rotor resistance value, and a leakage inductance value of a T-I type equivalent circuit of an induction motor, respectively.

10. The method according to claim 9, wherein the predetermined angular frequency $\omega_1$ is selected in accordance with the following expression, $$\omega_1 < \sqrt{\frac{R'_2(2R_1 + R'_2)}{2L_\sigma M'}}$$

where $R_1$, $R_2'$, and $L\sigma$ represent a stator resistance value, a rotor resistance value, and a leakage inductance value of the induction motor, respectively, and M' represents a standard mutual inductance value of an induction motor having the same power as the induction motor to be measured.

11. A method for measuring motor parameters of an induction motor, comprising the steps of:

applying a voltage to an induction motor in a single-phase feed state to cause a sine wave current having a predetermined angular frequency $\omega_1$ to flow; and solving the following equation to find a mutual inductance value M', $$\begin{cases} k_2 = \dfrac{-\omega_1 L_\sigma R'_2 + \sqrt{(\omega_1 L_\sigma R'_2)^2 - \{R_1^2 + (\omega_1 L_\sigma)^2 - Z^2\}\{(R_1 + R'_2)^2 + (\omega_1 L_\sigma)^2 - Z^2\}}}{(R_1^2 + R'_2)^2 + (\omega_1 L_\sigma)^2 - Z^2} \\ M' = \dfrac{k_2 R'_2}{\omega_1} \end{cases}$$

where $V_1$ represents a value of an applied voltage, $I_1$ represents a value of a motor current, Z represents a ratio of the applied voltage to the motor current $|V_1|/|I_1|$, and $R_1$, $R_2'$, and $L\sigma$ represent a known stator resistance value, a rotor resistance value, and a leakage inductance value of a T-I type equivalent circuit of an induction motor, respectively.

12. The method according to claim 11, wherein the predetermined angular frequency $\omega_1$ is selected in accordance with the following expression, $$\omega_1 < \sqrt{\frac{R'_2(2R_1 + R'_2)}{2L_\sigma M'}}$$

where $R_1$, $R_2'$, and $L\sigma$ represent a stator resistance value, a rotor resistance value, and a leakage inductance value of the induction motor, respectively, and M' represents a standard mutual inductance value of an induction motor having the same power as the induction motor to be measured.

13. A control apparatus for an induction motor, comprising:

a driver having a variable output voltage and frequency;

a motor parameter measurement system for measuring motor parameters of the induction motor driven by the driver;

a slip frequency operator for deriving a slip frequency from a rotor resistance and inductance of the induction motor, an excitation current command, and a torque current command;

an induction motor current command output means for deriving a current to flow in the induction motor, from the torque current command, the excitation current command, a detected or estimated rotational speed of the induction motor, and the slip frequency, so as to output a current command; and a current controller for comparing the induction motor current command and a detected current of the induction motor to output a voltage command according to a compared result;

wherein the motor parameter measurement system outputs a current command having a frequency of a predetermined value or more and a current waveform of a triangular wave for setting the induction motor to be in a single-phase feed state, the current controller provides the driver with a voltage command to follow the current command, and the motor parameter measurement system solves two equations obtained from detected or commanded voltage values and detected motor current values at two different times and a current differential value to find a sum of a stator resistance value and a rotor resistance value of a T-I type equivalent circuit of the induction motor, and finds the rotor resistance value from a difference between the sum of the stator resistance value and the rotor resistance value and the known stator resistance value, the stator resistance value and the rotor resistance value being used for a slip frequency operation by the slip frequency operator and a speed estimation by a speed estimator.

14. The control apparatus according to claim 13, wherein times at which differential values of motor current are equal and current values are different are selected as the two different times.

15. The control apparatus according to claim 13, wherein times at which differential values of motor current are different and current values are equal are selected as the two different times.

16. A control apparatus for an induction motor, comprising:

a driver having a variable output voltage and frequency;

a motor parameter measurement system for measuring motor parameters of the induction motor driven by the driver;

a slip frequency operator for deriving a slip frequency from a rotor resistance and inductance of the induction motor, an excitation current command, and a torque current command;

an induction motor current command output means for deriving a current to flow in the induction motor, from the torque current command, the excitation current command, a detected or estimated rotational speed of the induction motor, and the slip frequency, so as to output a current command; and a current controller for comparing the induction motor current command and a detected current of the induction motor to output a voltage command according to a compared result;

wherein the motor parameter measurement system outputs a current command having a frequency of a predetermined value or more and a current waveform of a triangular wave for setting the induction motor to be in a single-phase feed state, the current controller provides the driver with a voltage command to follow the current command, and the motor parameter measurement system solves two equations obtained from detected or commanded voltage values and detected motor current values at two different times and a current differential value to find a leakage inductance value of a T-I type equivalent circuit of the induction motor, the leakage inductance value being used for a slip frequency operation by the slip frequency operator and a speed estimation by a speed estimator.

17. The control apparatus according to claim 16, wherein times at which differential values of motor current are equal and current values are different are selected as the two different times.

18. The control apparatus according to claim 16, wherein times at which differential values of motor current are different and current values are equal are selected as the two different times.

19. A control apparatus for an induction motor, comprising:

a driver having a variable output voltage and frequency;

a motor parameter measurement system for measuring motor parameters of the induction motor driven by the driver;

a slip frequency operator for deriving a slip frequency from a rotor resistance and inductance of the induction motor, an excitation current command, and a torque current command;

an induction motor current command output means for deriving a current to flow in the induction motor, from the torque current command, the excitation current command, a detected or estimated rotational speed of the induction motor, and the slip frequency, so as to output a current command; and a current controller for comparing the induction motor current command and a detected current of the induction motor to output a voltage command according to a compared result;

wherein the motor parameter measurement system outputs a sine wave current command having a predetermined angular frequency $\omega_1$ for setting the induction motor to be in a single-phase feed state, the current controller provides the driver with a voltage command to follow the current command, and the motor parameter measurement system solves the following equation to find a mutual inductance value M', a leakage inductance value being used for a slip frequency operation by the slip frequency operator and a speed estimation by a speed estimator, $$\begin{cases} k_1 &= \dfrac{-\omega_1 L_o R'_2 - \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{R_1^2 + (\omega_1 L_o)^2 - Z^2} \\ M' &= \dfrac{R'_2}{k_1 \omega_1} \end{cases}$$

where $V_1$ represents a detected or commanded voltage value, $I_1$ represents a detected motor current value, Z represents a ratio of the voltage to the motor current $|V_1|/|I_1|$, $R_1$, $R_2'$, and $L\sigma$ represent a known stator resistance value, a rotor resistance value, and a leakage inductance value of a T-I type equivalent circuit of an induction motor, respectively.

20. The control apparatus according to claim 19, wherein the predetermined angular frequency $\omega_1$ is selected in accordance with the following expression, $$\omega_1 < \sqrt{\dfrac{R'_2(2R_1 + R'_2)}{2L_o M'}}$$

where $R_1$, $R_2'$, and $L\sigma$ represent a stator resistance value, a rotor resistance value, and a leakage inductance value of the induction motor, respectively, and M' represents a standard mutual inductance value of an induction motor having the same power as the induction motor to be controlled.

21. A control apparatus for an induction motor, comprising:

a driver having a variable output voltage and frequency;

a motor parameter measurement system for measuring motor parameters of the induction motor driven by the driver;

a slip frequency operator for deriving a slip frequency from a rotor resistance and inductance of the induction motor, an excitation current command, and a torque current command;

an induction motor current command output means for deriving a current to flow in the induction motor, from the torque current command, the excitation current command, a detected or estimated rotational speed of the induction motor, and the slip frequency, so as to output a current command; and a current controller for comparing the induction motor current command and a detected current of the induction motor to output a voltage command according to a compared result;

wherein the motor parameter measurement system outputs a sine wave current command having a predetermined angular frequency $\omega_1$ for setting the induction motor to be in a single-phase feed state, the current controller provides the driver with a voltage command to follow the current command, and the motor parameter measurement system solves the following equation to find a mutual inductance value M', a leakage inductance value being used for a slip frequency operation by the slip frequency operator and a speed estimation by a speed estimator, $$\begin{cases} k_2 &= \dfrac{-\omega_1 L_o R'_2 + \sqrt{(\omega_1 L_o R'_2)^2 - \{R_1^2 + (\omega_1 L_o)^2 - Z^2\}\{(R_1 + R'_2)^2 + (\omega_1 L_o)^2 - Z^2\}}}{(R_1^2 + R'_2)^2 + (\omega_1 L_o)^2 - Z^2} \\ M' &= \dfrac{k_2 R'_2}{\omega_1} \end{cases}$$

where $V_1$ represents a detected or commanded voltage value, $I_1$ represents a detected motor current value, Z represents a ratio of the voltage to the motor current $|V_1|/|I_1|$, and $R_1$, $R_2'$, and $L\sigma$ represent a known stator resistance value, a rotor resistance value, and a leakage inductance value of a T-I type equivalent circuit of an induction motor, respectively.

22. The control apparatus according to claim 21, wherein the predetermined angular frequency $\omega_1$ is selected in accordance with the following expression, $$\omega_1 < \sqrt{\dfrac{R'_2(2R_1 + R'_2)}{2L_o M'}}$$

where $R_1$, $R_2'$, and $L\sigma$ represent a stator resistance value, a rotor resistance value, and a leakage inductance value of the induction motor, respectively, and M' represents a standard mutual inductance value of an induction motor having the same power as the induction motor to be controlled.

\* \* \* \* \*